United States Patent [19]
Caglio et al.

[11] Patent Number: 5,689,818
[45] Date of Patent: Nov. 18, 1997

[54] MOBILE TERMINAL DEVICE FOR TELECOMMUNICATIONS, INCLUDING A SWITCH CIRCUIT

[75] Inventors: Nathalie Caglio, Limeil-Brevannes; Didier Meignant, Emerainville, both of France

[73] Assignee: U.S. Philips Corporation, New York, N.Y.

[21] Appl. No.: 576,540

[22] Filed: Dec. 21, 1995

[30] Foreign Application Priority Data

Dec. 29, 1994 [FR] France .................... 94 15873

[51] Int. Cl.⁶ .................................. H04B 1/44
[52] U.S. Cl. .................. 455/83; 455/82; 333/103
[58] Field of Search .................. 333/101, 103, 333/104; 455/73, 78, 82, 83, 84, 89, 129, 80; 370/280; 327/427

[56] References Cited

U.S. PATENT DOCUMENTS

| | | |
|---|---|---|
| 4,399,557 | 8/1983 | Muszkiewizz .................... 455/82 |
| 4,677,688 | 6/1987 | Yoshihara et al. .................... 333/103 |
| 4,810,911 | 3/1989 | Noguchi .................... 333/103 |
| 5,548,239 | 8/1996 | Kohama .................... 455/83 |

*Primary Examiner*—Nguyen T. Vo
*Attorney, Agent, or Firm*—Arthur G. Schaier

[57] ABSTRACT

A mobile terminal device for telecommunications includes a switch circuit which comprises two field effect transistors connected in series to an input terminal, an output terminal and a common input/output terminal respectively, for AC signals. The switch circuit includes control devices which are cyclically shifted for the two transistors. The control devices are formed by pulsed multiplexed bias voltages of amplifiers which produce and receive the AC signals, and by a logic OR-circuit of diodes and resistor. The voltages on the terminals of the diodes are connected between the gate and source of the transistors for their cyclically time-shifted control.

7 Claims, 5 Drawing Sheets

5,689,818

MOBILE TERMINAL DEVICE FOR TELECOMMUNICATIONS, INCLUDING A SWITCH CIRCUIT

BACKGROUND OF THE INVENTION

1. Field of the Invention

The invention relates to a mobile terminal device for telecommunications, which comprises:
- a transceiving aerial,
- a section for data transmission, including a transmitting amplifier which has a first pulsed bias voltage and applies a first AC signal to an input terminal,
- a section for data reception, including a receiving amplifier which has a second, time-division multiplexed pulsed bias voltage and receives a second AC signal from an output terminal,
- a switch circuit including a first and a second field effect transistor arranged as switching transistors connected in series between said input terminal and said output terminal which switching transistors have a common terminal connected to the aerial.

The invention finds its application in the field of telecommunications in portable apparatus.

2. Discussion of the Related Art

A switch circuit is already known from U.S. Pat. No. 4,810,911 (Noguchi). This document describes a switch circuit having a common input/output terminal, two input/output switch terminals, two field-effect transistors connected in series between the common input/output terminal and the two input/output switch terminals, respectively. This circuit further includes transistors inserted between the two input/output switch terminals and ground respectively, and resistors inserted between ground and the common input/output terminal, and between ground and the two input/output switch terminals, respectively. These resistors are selected for having a resistance that is smaller than that of the field effect transistors arranged to operate as shunt transistors when the latter are blocking (OFF-state).

This circuit is formed by field effect transistors of the MESFET type which have a negative threshold voltage and which are rendered blocking when a more negative control voltage than the threshold voltage is applied to the gate.

The control of these transistors makes it thus necessary to utilize at least a negative supply voltage. This is a drawback in the case where the circuit is included in a portable apparatus fed by batteries which provide only a positive DC supply voltage.

Subsequently, in this known circuit, the two transistors connected in series between the common terminal and the two input/output terminals are switching transistors controlled, on the one hand, by a first negative DC voltage $V_{G1}$ and, on the other hand, by a second negative DC voltage $V_{G2}$. The use of more than one negative supply voltages is thus an even greater disadvantage in the case where the circuit is included in a portable apparatus fed by batteries which provide only a positive DC supply voltage.

Moreover, in this known circuit, these negative DC voltages have adequate values, so that the first series-connected transistor is conductive (switching transistor closed) exactly at the same time when the second series-connected transistor is cut off (switching transistor open). This is inconvenient in the case where the circuit is used in a mobile terminal device for telecommunications, because this does not permit several users connected to one terminal (or base) to share a given time interval with each other for simultaneous transmission and/or reception.

SUMMARY OF THE INVENTION

The technical problem which is proposed to be resolved as the object of the present invention will be discussed hereafter.

For being used in a mobile terminal device for telecommunications, a switch circuit which has a common input/output terminal, for example, connected to an aerial, and has two other terminals, one for the input of an AC signal coming from a transmitter propagated towards the aerial, and the other for the output to a receiver of an aerial signal is to have:

- firstly, a switching transistor in the transmitting circuit and a switching transistor in the receiving circuit, which switching transistors are controlled in such a way that transmission and reception does not occur at the same time, which would lead to losses,
- then, control means for controlling these switching transistors, so that they do not operate exactly in phase opposition as known from the cited document, but for producing a time offset in the transmitting/receiving function and for managing this transmitting/receiving function in a cyclic ratio between a length of a pulse period during which a transmission or a reception can take place, a frequency at which the pulses are produced, and a time offset between a transmitting pulse and a receiving pulse, while the ratio between pulse length and pulse frequency is determined, and determination of the time offset between the transmitting and receiving pulses makes it possible for a telecommunication base to manage the switching between several lines, so that various users are enabled to transmit or receive simultaneously at the same frequency;
- means to be able to utilize directly a positive supply voltage produced by batteries,
- additionally, means for economizing on the energy consumption of the mobile terminal device for telecommunications, so that the latter can be used operating on batteries,
- and, furthermore, be compact, contain few elements and utilize a smallest possible number of DC bias voltage levels.

These problems are solved by a device as described in the introductory part and which furthermore includes:
a logic OR circuit formed by a first and a second diode which have a common terminal, which circuit is connected to ground via a resistor, which diodes receive the first and the second multiplexed bias voltage respectively, so that at the terminals of these diodes are obtained a first and a second multiplexed pulsed voltage difference applied between the control electrodes of the first and second switching transistors and the common terminal connected to the aerial via bias resistors, to render the first switching transistor conductive and, at the same time, cut off the second switching transistor.

Such a mobile terminal device makes it possible for various users to use the same base station (terminal) simultaneously.

In a particular embodiment, this device comprises DC-isolating capacitors connected between the aerial and the common terminal of the switching transistors, and between the input and output terminals of the transmitting and receiving amplifiers respectively and the switch circuit, to make this switch circuit floating relative to ground.

In such a floating circuit, the transistors of the MESFET type are controlled by negative voltages, whereas the circuit itself receives the positive DC supply voltage produced by standard batteries.

BRIEF DESCRIPTION OF THE DRAWINGS

These and other aspects of the invention will be apparent from and elucidated with reference to the embodiments described hereinafter.

In the drawings.

DESCRIPTION OF PREFERRED EMBODIMENTS

Figure 1A:
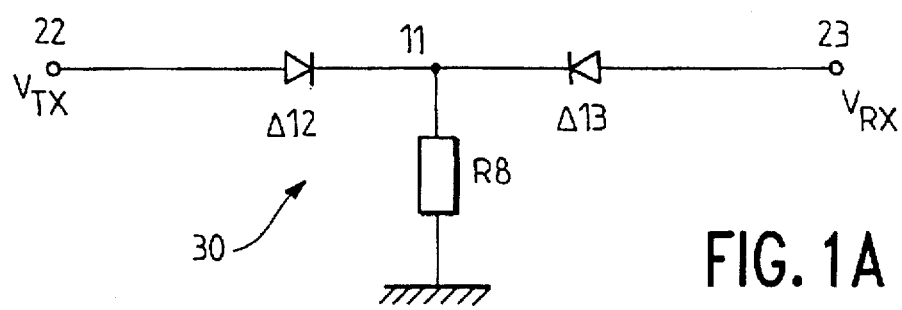
FIG. 1A shows a logic OR-circuit.
Figure 1B:
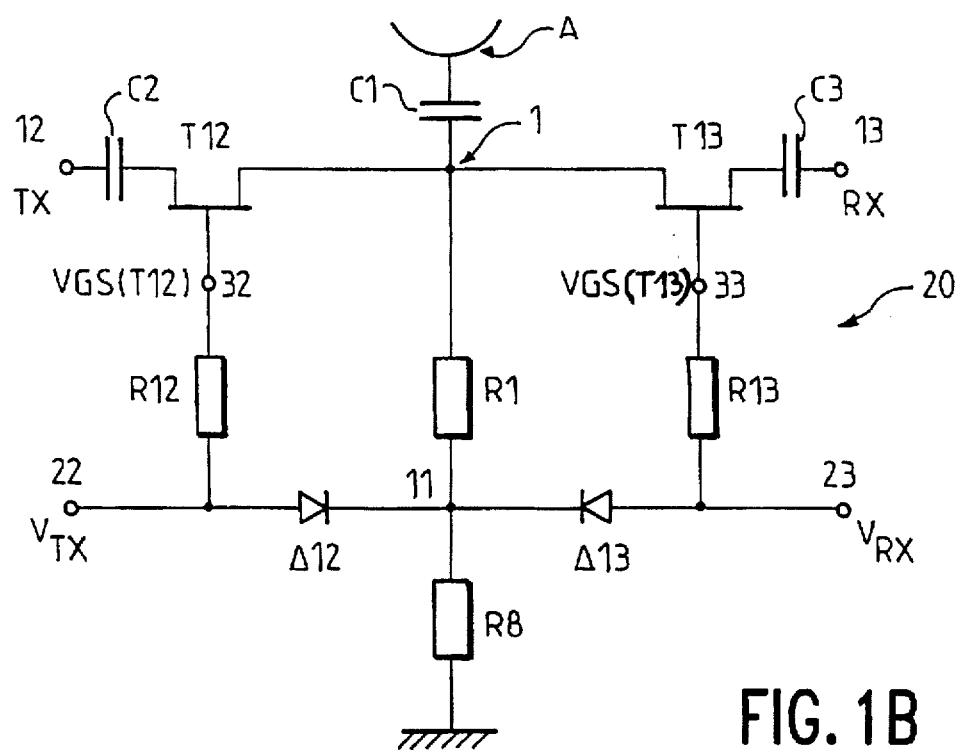
FIG. 1B shows a first mode of operation of a switch circuit with cyclically shifted transmitting and receiving commands.
Figure 4:
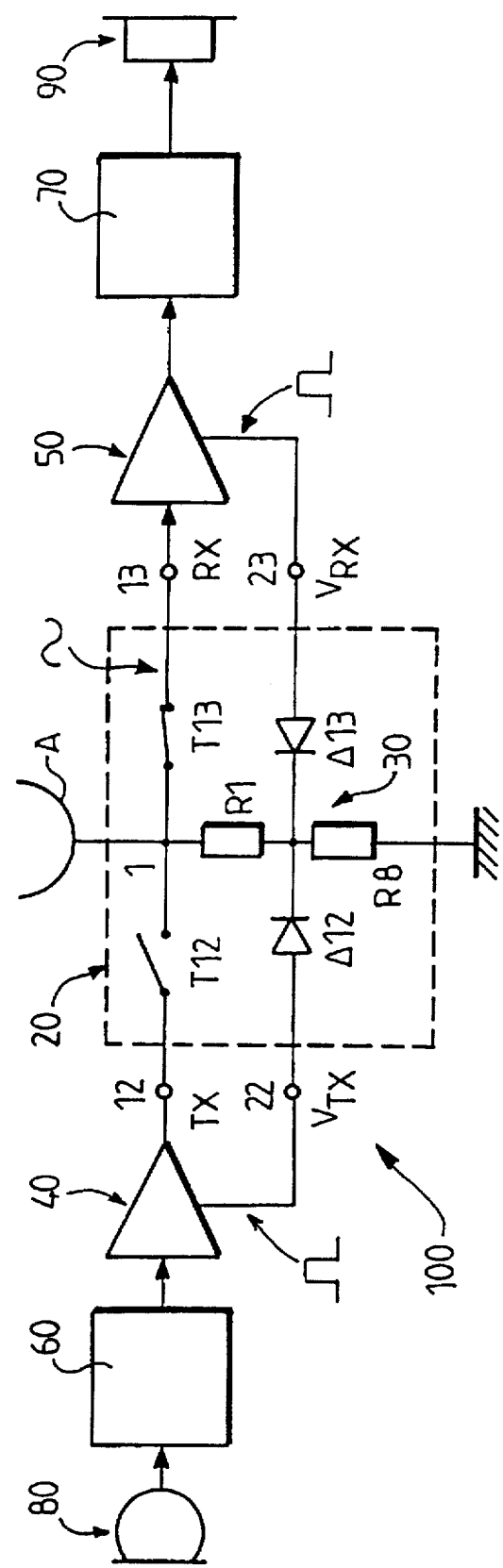
FIG. 4 represents a mobile terminal device which includes the circuit shown in FIG. 1B, or FIGS. 3A to 3C.

With reference to the drawing FIGS. 1B and 4, a mobile terminal transceiving device which includes a switch circuit 20 to be applied to telecommunications services, basically includes:

- a terminal 1, referenced first common terminal, to be used as an AC signal input or output. In the example to be described below, this first input/output terminal is connected to an aerial A and is also DC biased by a first DC supply voltage $V_D$ via the resistor R1.
- a second input terminal 12, reserved for the input of an AC signal TX which comes from a transmitting circuit 80, 60, 40 and is propagated to aerial A,
- a third output terminal 13, reserved for the output of an AC signal RX which comes from the aerial and is propagated via this terminal 13 to a receiving circuit 50, 70, 90,
- a field effect transistor T12, operating as a switching transistor, connected in series between the first common terminal 1 and the input terminal 12 of the transmitting signal TX,
- a field effect transistor T13, operating as a switching transistor, connected in series between the common terminal 1 and the first output terminal 13 of the received signal RX,
- a control signal $V_{GS(T12)}$ applied between the gate and source of the field effect transistor T12 to render it conductive or cut it off: when the transistor T12 is conductive, the signal TX is propagated from the input terminal 12 to the aerial A,
- a control signal $V_{GS(T13)}$ applied between the gate and source of the field effect transistor T13 to render it conductive or cut it off: when the transistor T13 is conductive, the signal RX is propagated from the first common terminal 1 (connected to aerial A) to the output terminal 13.

To avoid signal losses, the transistor T13 arranged as a switching transistor is to be cut off while the transistor T12 arranged as a switching transistor is conductive. Thus, either a signal TX enters terminal 12 and is propagated to aerial A, or a signal RX comes from aerial A and leaves through terminal 13, but the signals TX and RX are not propagated at the same instant.

Moreover, in the field of telecommunications, a line switch management base is to be capable of managing 8 lines or users, who simultaneously transmit or receive at the same frequency, by a device that uses such a circuit.

Under these circumstances, the control signals of the switching transistors T12 and T13 need not strictly be in phase opposition, and thus cannot be managed via further clock signals, whereas, nevertheless, either of these two transistors T12 or T13 is to be cut off while the other transistor is conductive.

Besides, since this switch circuit is used in a mobile device, the solutions which make use of various bias voltages, more particularly, negative bias voltages and/or a large number of additional elements, are to be avoided. It is important that a single standard positive voltage battery be used to provide the DC voltage supply for the mobile terminal device.

According to the invention, for controlling the transistors T12 and T13, the bias voltage $V_{TX}$ of the amplifier 40 of the transmitter of the signal TX is used, and also the bias voltage $V_{RX}$ of the amplifier 50 of the receiver of signal RX. These two amplifiers 40, 50 are included, of necessity, in the application described here. These bias voltages $V_{RX}$ and $V_{TX}$ are positive voltages and time-division multiplexed, for example, by a microcontroller. The shape of these voltages will be diagrammatically shown hereafter with reference to the time diagram of FIG. 2.

Figure 2:
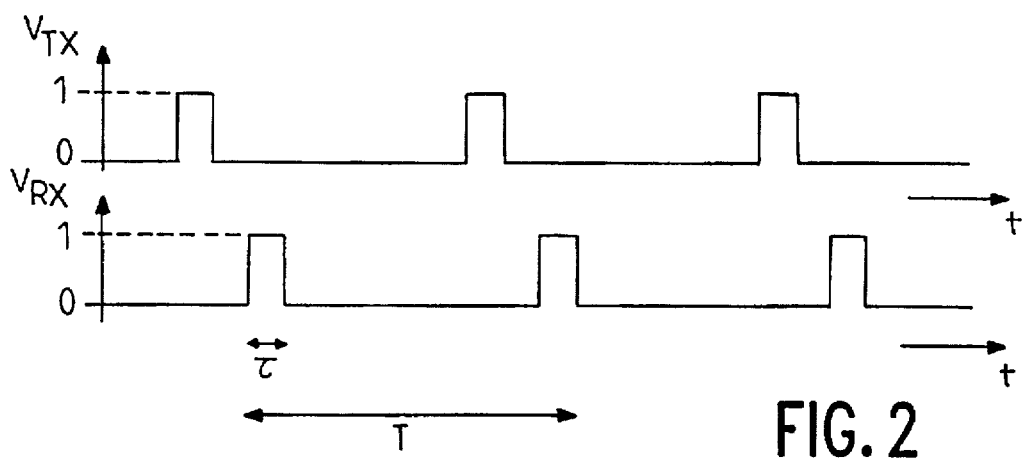
FIG. 2 shows a time diagram representing the pulsed bias voltages of the transmitting and receiving amplifiers.

With reference to FIG. 2, there are represented in the time diagram the signal $V_{TX}$ and also the bias signal $V_{RX}$ of the amplifiers 40 and 50. Each of these signals $V_{TX}$ and $V_{RX}$ shows pulses of length σ during which the corresponding bias voltages are used for controlling the transistors T12 and T13 and rendering them conductive. As these pulses are shifted, the switching transistors T12 and T13 are not conductive simultaneously. Furthermore, the pulses of each signal $V_{TX}$ and $V_{RX}$ show rising edges separated by a period of time T which is large compared with the duration σ of one pulse. For example, the duration σ of a pulse may be ⅛ the period T that separates one pulse from the next. Thus, it is possible, as required, to manage 8 lines or users simultaneously.

These bias voltages $V_{TX}$ and $V_{RX}$ coming from the amplifiers 40 and 50 of the transmitter and the receiver respectively, are associated with circuit elements to be described hereafter for forming the control voltages of the switching transistors T12, T13.

These elements comprise:

- a terminal 22 for the bias voltage $V_{TX}$ coming from the transmitting amplifier 40,
- a terminal 23 for the bias voltage $V_{RX}$ coming from the receiving amplifier 50,
- a terminal 32 for applying a control voltage $V_{GS(T13)}$ to the gate of switching transistor T12,
- a terminal 33 for applying a control voltage $V_{GS(T13)}$ to the gate of the switching transistor T13,
- a terminal 11 at the end of the resistor R1 opposite to the first common terminal 1 connected to the aerial A, which terminal 11 is referenced second common terminal, on which is present a bias voltage $V_D$,
- a resistor R12 between the terminals 22 and 32,
- a resistor R13 between the terminals 23 and 33,
- a resistor R8 between the terminal 11 and ground,
- a diode Δ12 between the terminals 22 and 11,
- a diode Δ13 between the terminals 23 and 11.

With reference to FIG. 1A, the two diodes Δ12 and Δ13 and the resistor R8 form a logic diode circuit 30. This logic circuit 30 forms a logic "OR" gate used in the switch circuit 20 for obtaining the control voltages suitable for the control electrode (gate) of transistors T12, T13 via pulsed bias voltages $V_{TX}$ and $V_{RX}$. The "OR" function is found in node 11.

The switch circuit 20 shown in FIG. 1B is favourably provided by utilizing field effect transistors of the MESFET type, of which the cut-off voltage is negative, of the order of −2 volts. These MESFET transistors are normally conductive when there is no gate-source voltage, or for a voltage higher than the cut-off voltage, and are cut off when the gate-source voltage has a lower value than the cut-off voltage.

Besides, in the switch circuit 20, the field effect transistors T12 and T13 are DC-isolated by capacitors C2, C3 located at the input/output 12, 13 and by the capacitor C1 located between the common terminal 1 and the aerial A. This makes it possible to render these transistors floating relative to ground and thus obtain the negative voltage which is necessary for their being cut-off, based on positive multiplexed bias voltages generated by means of a positive bias voltage produced by a standard battery.

The operation of this switch circuit 20 is the following:
a) When the bias voltage $V_{TX}$ is present on terminal 22, it causes diode Δ12 to be biased. The voltage drop at the terminals of the diode is denoted $V_\Delta$. The voltage on terminal 11 is $V_D$ equalling $V_{TX}$ less the voltage drop $V_\Delta$ in the diode Δ12, that is to say, $V_D = V_{TX} - V_{66}$. As no current whatsoever flows in either bias resistor R12 or R13, the voltage difference between node 22 and node 11 on the terminals of the diode Δ12 of the logic circuit 30 is thus exactly carried between node 32 and node 1, between the gate and source of the switching transistor T12. Thus the gate-source voltage of the transistor T12 is:

$$V_{GS(T12)} = V_{TX} - (V_{TX} - V_\Delta) = V_\Delta$$

The voltage drop at the terminals of a diode realised with the same technology as the MOSFET field effect transistors T12 and T13 is of the order of:

$$V_\Delta \cong 0.5 \text{ volt}$$

where $V_{GS(T12)} \cong 0.5$ volt
which renders this transistor T12 conductive.

In the case where the bias voltage $V_{TX}$ is in the ONE state on terminal 12, because of aforementioned multiplexing, $V_{RX}$ is of necessity in the ZERO state on terminal 23. In this case the gate-source voltage of transistor T13:

$$V_{GS(T13)} = -V_{TX} + V_\Delta$$

The transistor T13 is thus cut off because the voltage $V_{TX}$ is of the order of 3 to 6 volts. b) When the bias voltage $V_{RX}$ is present on terminal 23, it then causes diode Δ13 to be biased, and the effect described with reference to a) is reversed: the switching transistor T13 becomes conductive, whereas the switching transistor T12 is cut off.

The advantage of the switch circuit 20 is that the control voltages suitable for the switching transistors T12 and T13 are generated, and that at the same time the DC voltage $V_D$ which was necessary on terminal 11 is also generated. This switch circuit 20 thus does not use other supply voltages than those of the transmitting amplifier 40 and receiving amplifier 50 already discussed.

Figure 3A:
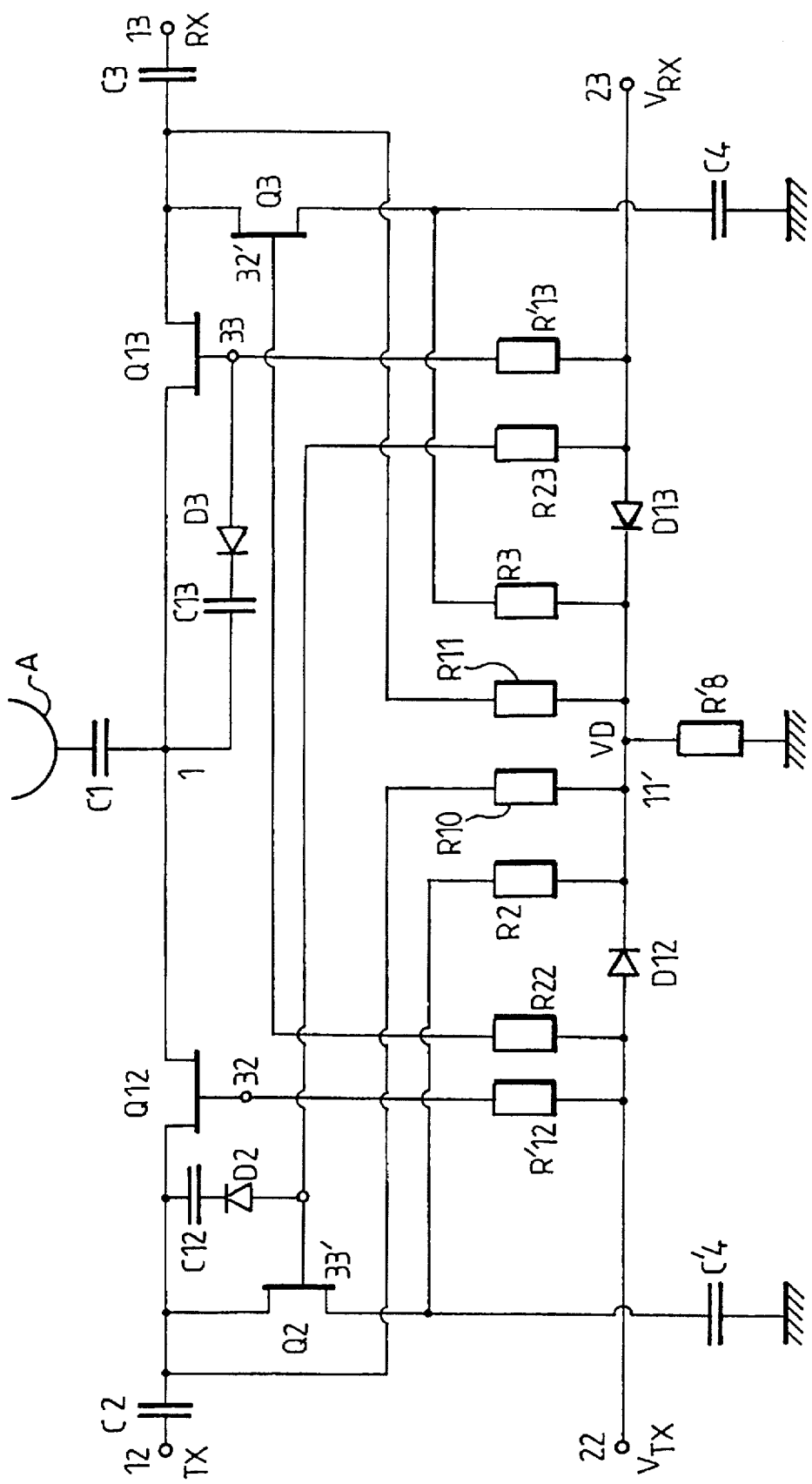
FIGS. 3A, 3B, 3C show a second mode of operation of a switch with cyclically shifted transmitting and receiving commands with two variants.
Figure 3B:
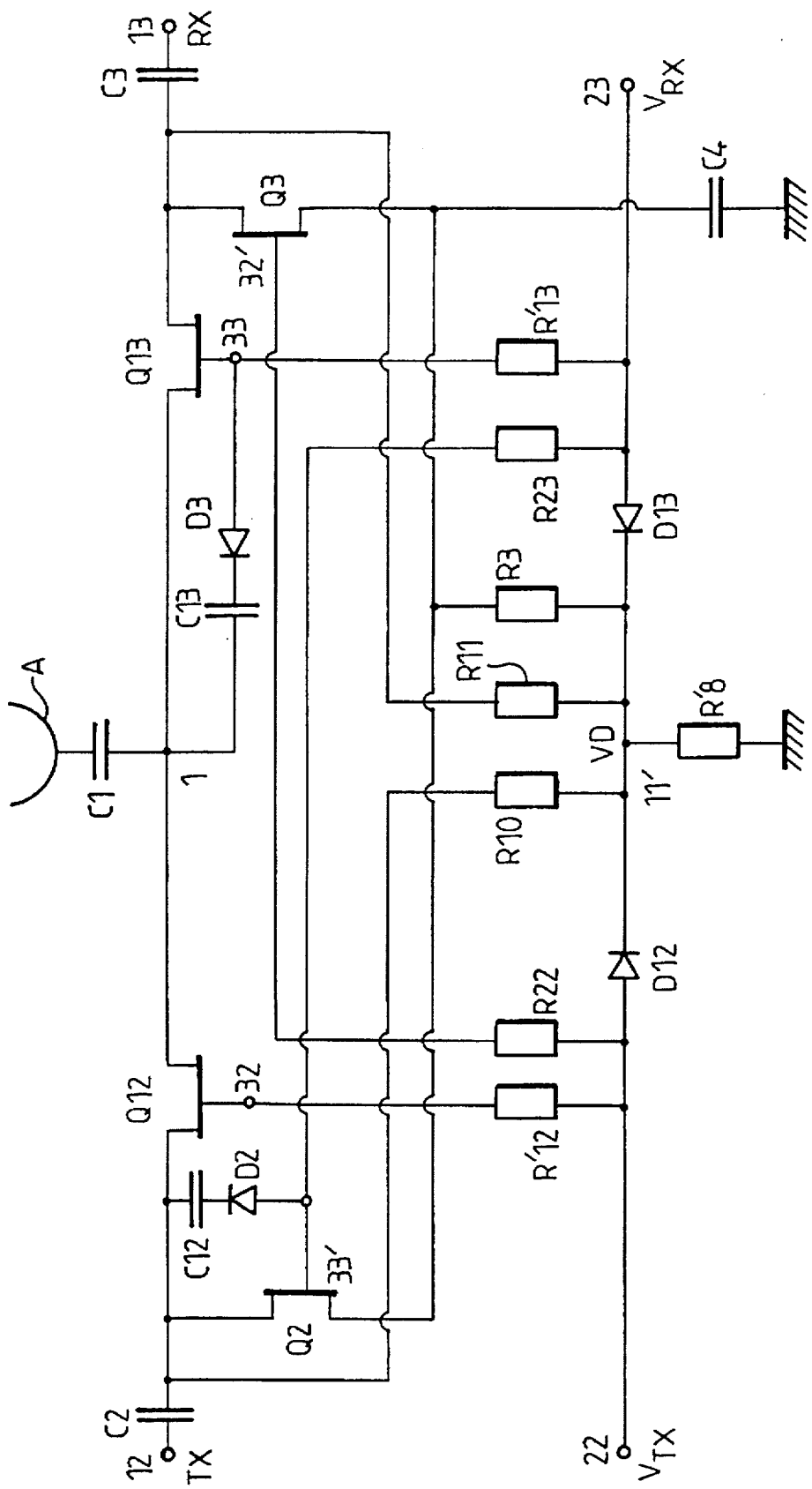
Figure 3C:
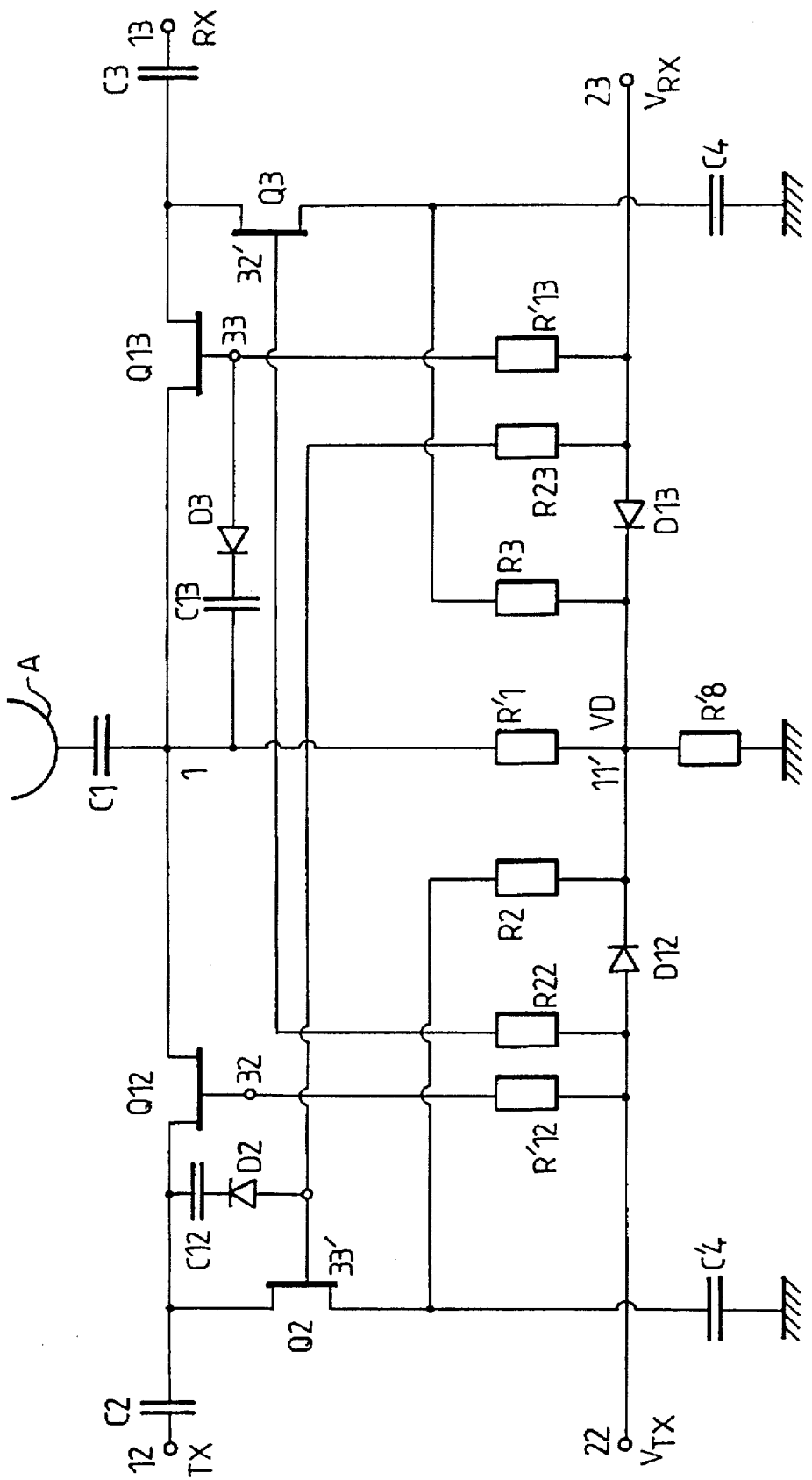

With reference to FIGS. 3A, 3B, 3C, in another embodiment, a switch circuit 20 has a first terminal I referenced first common terminal, for the input or output of an AC signal. In the embodiments to be described hereafter, this first input/output terminal is connected to an aerial A.

a second input terminal 12, resented for the input of an AC signal TX, coming from a transmitter 40 diagrammatically represented in FIG. 4, and propagated to aerial A, a third output terminal 13, reserved for the output of an AC signal RX coming from the aerial and propagated via this terminal 13 to a receiver 50 diagrammatically shown in FIG. 4, a field effect transistor Q12 operating as a switching transistor, connected in series between the common terminal 1 and the input terminal 12 of the transmitting signal TX, a field effect transistor Q13 operating as a switching transistor, connected in series between the common terminal 1 and the output terminal 13 of the received signal RX, a control signal $V_{GS(Q12)}$ applied between the gate and source of the field effect transistor Q12 to render this transistor conductive or cut this transistor off when the switching transistor Q12 is conductive, the signal RX is propagated from the input terminal 12 to the aerial A, a control signal $V_{GS(Q13)}$ applied between the gate and source of the field effect transistor Q13 to render this transistor conductive or cut this transistor off when the switching transistor Q13 is conductive, the signal RX is propagated from the common terminal 1 connected to the aerial A to the output terminal 13.

For generating the control voltages $V_{GS(Q13)}$ and $V_{GS(Q12)}$, as explained above with reference to FIG. 1B in the discussion of the generation of control voltages $V_{GS(T13)}$ and $V_{GS(T12)}$, the switch circuit 20 of this second embodiment further has:

a terminal 22 for the bias voltage $V_{TX}$ coming from the transmitting amplifier 40 (see FIG. 4), a terminal 23 for the bias voltage $V_{RX}$ coming from the receiving amplifier 50 (see FIG. 4), a second common terminal 11', a diode D13 between the input terminal 23 of the bias voltage $V_{RX}$ and the second common terminal 11', a diode D12 between the input terminal 22 of the bias voltage $V_{TX}$ and the second common terminal 11', the second common terminal 11' connected to ground via a resistor R'8.

In this second embodiment illustrated by the FIGS. 3A, 3B, 3C, the diodes D12, D13 and the resistor R'8 form a logic circuit 30 having the "OR" function as that of FIG. 1A. The voltages available on the diode terminals D12, D13 are referenced gate-source control voltages of the switching transistors (series transistors) Q12, Q13, respectively.

This circuit furthermore includes transistors Q2 and Q3 in a shunt arrangement, the first transistor Q2 between the input terminal 12 and a resistor R2 or R3, and the second transistor Q3 between the output terminal 13 and a resistor R3, while the other end of the resistor R2 and/or R3 is connected to the second common terminal 11'.

The transistor Q3 arranged as a shunt transistor is controlled in the same manner as the series-connected transistor Q12 to be simultaneously conductive. The transistor Q2 arranged as a shunt transistor is controlled in the same manner as transistor Q13 to be simultaneously conductive.

This circuit further has:

terminals 32 and 32' for applying a control voltage $V_{GS(Q12)}$ to the gate of the series-connected transistor Q12 and shunt transistor Q3; these terminals 32 and 32' are connected to the input terminal 22 of the bias signal $V_{TX}$ of the transmitting amplifier through resistors R'12, R22, terminals 33 and 33' for applying a control voltage $V_{GS(Q13)}$ to the gate of the series-connected transistor Q13 and shunt transistor Q2; these terminals 33 and 33' are connected to the input terminal 23 of the bias signal $V_{RX}$ that comes from the receiving amplifier through resistors R'13, R23, respectively.

In the embodiments illustrated by FIGS. 3A and 3B, the circuit also includes:

a resistor R10 between the second common terminal 11' and the input 12 of the transmitting signal TX, a resistor R11 between the second common terminal 11' and the output 13 of the received signal RX.

In a particular embodiment shown in FIG. 3C the terminal 11' is connected to terminal 1 via a resistor R'1, and in this case the links via the resistors R10 and R11 shown in FIGS. 3A and 3B are omitted.

In the embodiments illustrated by FIGS. 3A and 3C, the sources of the shunt transistors Q2 and Q3 are not common sources, but are connected respectively to the second common terminal 11' via the resistors R2 and R3, and to ground via the capacitors C'4 and C4.

In the embodiment shown in FIG. 3B the sources of the shunt transistors Q2 and Q3 are common sources and connected to the terminal 11' via the sole resistor R3 and to ground via a sole capacitor C4.

The system formed by the shunt transistors Q2 and Q3 and their bias means makes it possible to eliminate the residual leakage currents of the series-connected transistors Q12 and Q13 in the cut-off mode.

An additional improvement is formed by:

diodes D3 and D2 connected, respectively, between the gate terminal 33 of the series-connected transistor Q13 and the common terminal 1, and between the gate terminal 33' of the shunt transistor Q2 and the input 12 of the transmitting signal TX.

These systems formed, respectively, by a diode and a capacitor make it possible to increase the power transmitted in the series-connected transistors Q12, Q13, without deforming the AC signals TX and RX. In effect, in the case where these systems are used, the gate of the transistors Q12, Q13 follows the maximum value of the AC signal that comes from terminal 12 or is propagated to terminal 13, via a detection by the diodes D2 and D3.

The switch circuit 20 proposed in this second embodiment illustrated by FIGS. 3A, 3B, 3C profits from the use of MESFET-type field effect transistors which have a negative cut-off frequency of the order of −2 volts, and can nevertheless operate with a low positive supply voltage realised by a standard battery of the order of 3 to 6 volts. This switch circuit does not need a specific supply voltage. This supply voltage which would occur at the common point 1 of the aerial has no reason for being produced independently by a battery in the present switch circuit.

The control voltages adequate for the switching transistors Q12 and Q3, on the one hand, and Q13 and Q2, on the other, are generated on the basis of the bias voltages $V_{TX}$ and $V_{RX}$ already present of necessity in the amplifier circuits 40 and 50 of the transmitting circuit and of the receiving circuit represented in FIG. 4. Besides, these bias voltages have already been time-division multiplexed, that is to say, cyclically shifted with reference to the time diagram of FIG. 2, and their use is thus particularly advantageous.

As the bias voltages $V_{TX}$ and $V_{RX}$ are never in the ONE state at the same time, that is to say, are never there at the same time, the circuit of FIGS. 3 can only have the following operating states:

A) When $V_{TX}$ is in the ONE state, the transistors Q12 and Q3 become conductive and the AC signal TX is propagated to the aerial. During this period of time $V_{RX}$ is in the ZERO state and the transistors Q13 and Q2 are cut off.

B) When $V_{TX}$ is in the ZERO state, the transistors Q12 and Q3 are cut off and the AC signal TX is not propagated, but in the ONE state during this period of time $V_{RX}$ is in the ONE state, of which the result is that the transistors Q13 and Q2 are conductive and the AC signal RX is propagated from aerial A to terminal 13.

During state A) the transistors Q12 and Q3 are conductive, because their gate-source voltages $V_{GS(Q12)}$ and $V_{GS(Q3)}$ equalize the voltage drop, of about 0.5 to 0.7 V in the diode D13 which is at that moment rendered conductive. The level of this voltage drop $V_A$ in the diode is sufficient to render these transistors conductive.

At the same time, the transistors Q13 and Q2 are cut off because their gate-source voltages $V_{GS(Q13)}$ and $V_{GS(Q2)}$ equalize the voltage drop of 0.5 to 0.7 in the diode D13 less the voltage $V_{TX}$ which is of the order of 3 to 6 volts. This voltage is thus sufficiently negative to keep the transistors cut off.

During state B) the situation is completely reversed.

For realising the circuit according to the invention, one may use elements which have the following values:

| R'12 = 2 kΩ | R22 = 2 kΩ |
|---|---|
| R2 = 2 kΩ | R'8 = 8 kΩ |

All the field effect transistors Q12, Q13, Q2, Q3 arranged as switching transistors are rendered floating transistors by the DC-isolating capacitors: C2 and C3 connected to the input/output terminals 12 and 13, C1 connected between the common terminal 1 and the aerial A, C4 connected between the common sources of the transistors Q2 and Q3 and ground (FIG. 3B), and C4, C'4 connected between the cut-off sources of the transistors Q2 and Q3 and ground (FIG. 3A and FIG. 3C). The values of these capacitances may be of the order of 10 pF. This floating arrangement makes it possible to obtain the negative control voltages of the transistors based upon the positive bias voltages.

With reference to FIG. 4, the switch circuit (20) is used in a mobile terminal device 100 for telecommunications.

This device may include:

a microphone 80 a transmitting amplifier 40 which uses a pulsed bias voltage $V_{TX}$ available on terminal 22, and produces an AC signal TX on its output 12 a switch circuit 20 connected to the aerial A at terminal 1, comprising two switching transistors T12 and T13 (or Q12 and Q13) connected in series on either one of the two sides of the common terminal 1; this switch circuit including a logic circuit which has an OR function 30 with diodes Δ12, Δ13 (or D12, D13) and resistor R8 or R'8; this switch circuit 20 having an input 12 for the signal TX, an input/output 1 for the aerial A, an output 13 for an AC signal RX, an input 22 for the pulsed bias signal $V_{TX}$, and an input 23 for a pulsed bias signal $V_{RX}$;

a receiving amplifier 50 utilizing a pulsed bias voltage $V_{RX}$ present on terminal 23 to be used by the switch circuit 20, and receiving from the latter the AC voltage RX on terminal 13;

a loudspeaker 90.

This device further includes various circuits such as an analog/digital or digital/analog converter, a coder and a decoder, adapters and so on, represented symbolically by block 60 between the microphone 80 and the amplifier 40, and the block 70 between the amplifier 50 and the loudspeaker 90.

These circuits do not actually form part of the invention and have not been described above.

This device 100 can be used by way of example in mobile systems of types currently referenced in telecommunications as:

GSM 900 (Global System for Mobile communication for 900 MHz)

DCS 1800 (Digital Communication System for 1800 MHz).

The operating protocol of these systems is of the type referenced TDMA (Time Division Multiple Access). In this protocol the supply voltages produced by positive batteries of 3 to 6 volts are generated in a pulsed form, shown in FIG. 2, for example by a microcontroller. The simultaneous use of telecommunication systems by various users is managed via terminals (or bases) geographically spread over a territory, so that their working range covers this territory.

We claim:

1. A mobile terminal device for telecommunications comprising:

a transceiving aerial;

a section for data transmission, including a transmitting amplifier which has a first, time-division multiplexed pulsed bias voltage and further which applies a first AC signal to an input terminal;

a section for data reception, including a receiving amplifier which has a second, time-division multiplexed pulsed bias voltage and further which receives a second AC signal from an output terminal;

a switch circuit including a first and a second field effect transistor arranged as switching transistors connected in series between the input terminal and the output terminal, wherein the switching transistors have a common terminal connected to the aerial; and a logic OR circuit formed by a first and a second diode which have a common terminal, wherein said OR circuit is connected to ground via a resistor, wherein the diodes receive the first and the second multiplexed bias voltage respectively, so that at the terminals of the diodes are obtained a first and a second multiplexed pulsed voltage difference applied between control electrodes of the first and second switching transistors and the common terminal of the diodes connected to the aerial via bias resistors, to render the first switching transistor conductive and, at the same time, cut off the second switching transistor.

2. The device as claimed in claim 1, further comprising DC-isolating capacitors connected between the aerial and the common terminal of the switching transistors, and between the input and output terminals of the transmitting and receiving amplifiers respectively and said switch circuit, to make said switch circuit floating relative to ground.

3. The device as claimed in claim 1, wherein said switch circuit further includes a first and a second field effect transistor arranged in a shunt mode between respectively the input terminal, the output terminal and the common terminal of the diodes, wherein the first and second field effect transistors are arranged as switching transistors and controlled, respectively, by control signals of the second series-connected transistor and of the first series-connected transistor, the control signals being controlled by said logic OR circuit based on multiplexed pulsed supply voltages coming from the transmitting amplifier and the receiving amplifier.

4. The device as claimed in claim 3, wherein said switch circuit includes branches formed by a diode and a DC-isolating capacitor connecting, respectively, the control electrode of the first shunt transistor and the input terminal, and the control electrode of the second series-connected transistor and the common terminal of the first and second series-connected transistors.

5. The device as claimed in claim 3, wherein said switch circuit includes DC isolating capacitors connected between the common terminal of the shunt transistors and ground to render these transistors floating relative to ground.

6. The device as claimed in claim 1, wherein the field effect transistors of said switch circuit are of the negative cut-off voltage type.

7. The device as claimed in claim 1, further including a microphone which has connecting means for connecting to the transmitting amplifier, and a loudspeaker which has connecting means for connecting to the receiving amplifier.

* * * * *